United States Patent [19]

Fujita et al.

[11] Patent Number: 4,628,595
[45] Date of Patent: Dec. 16, 1986

[54] AUTOMATIC INSERTING APPARATUS FOR ELECTRONIC PARTS

[75] Inventors: Takayuki Fujita, Hirakata; Hirotoshi Shigehara, Neyagawa; Shigetoshi Negishi, Suita; Takayoshi Kyotani, Hirakata; Shozo Kadota, Osaka, all of Japan

[73] Assignee: Matsushita Electric Industrial Co., Ltd., Osaka, Japan

[21] Appl. No.: 705,471

[22] PCT Filed: Jun. 5, 1984

[86] PCT No.: PCT/JP84/00289
§ 371 Date: Feb. 7, 1985
§ 102(e) Date: Feb. 7, 1985

[87] PCT Pub. No.: WO84/05011
PCT Pub. Date: Dec. 20, 1984

[30] Foreign Application Priority Data

Jun. 7, 1983 [JP] Japan .................. 58-102065

[51] Int. Cl.⁴ .............................................. H05K 3/30
[52] U.S. Cl. ........................................ 29/741; 29/759
[58] Field of Search ........... 29/741, 739, 759, 834–839

[56] References Cited

U.S. PATENT DOCUMENTS 4,434,550  3/1984  Wilke et al. ................. 29/741 X

FOREIGN PATENT DOCUMENTS 977528  11/1975  Canada .................. 29/741
55-30858  3/1980  Japan .

Primary Examiner—Carl E. Hall
Attorney, Agent, or Firm—Wenderoth, Lind & Ponack

[57] ABSTRACT

An automatic inserting apparatus for electronic parts which are continuously supplied and inserted into inserting holes (21) in a printed circuit board (20), including a supply mechanism for supplying electronic parts (4) which have lead wires (5), an apparatus for sharpening the tips of the lead wires and orienting the electronic parts in a predetermined position with the lead wires (5) oriented downwards, and a guide mechanism equipped with a plurality of guide pins (47) arranged below the printed circuit board (20) for movement up and down and adapted to retain the tips of the lead wires (5) of the electronic parts (4) which have been inserted through the inserting holes (21) in the printed circuit board (20), in order to make it possible that the electronic parts can be assuredly inserted in the printed circuit board having the inserting holes of small outer diameter.

14 Claims, 34 Drawing Figures

Fig. 25
Fig. 26
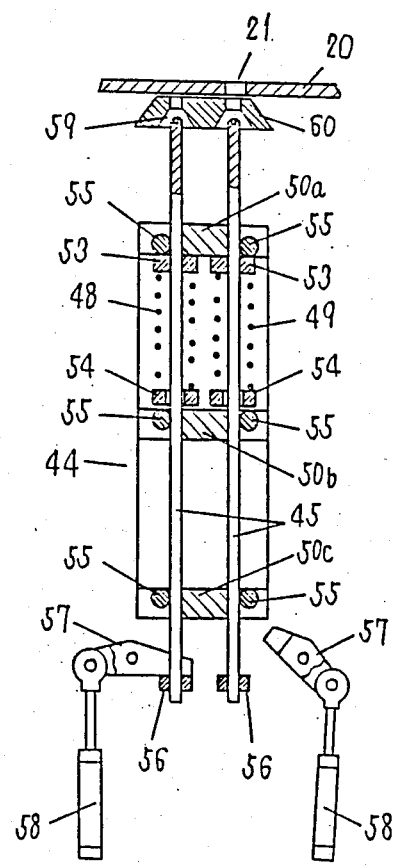
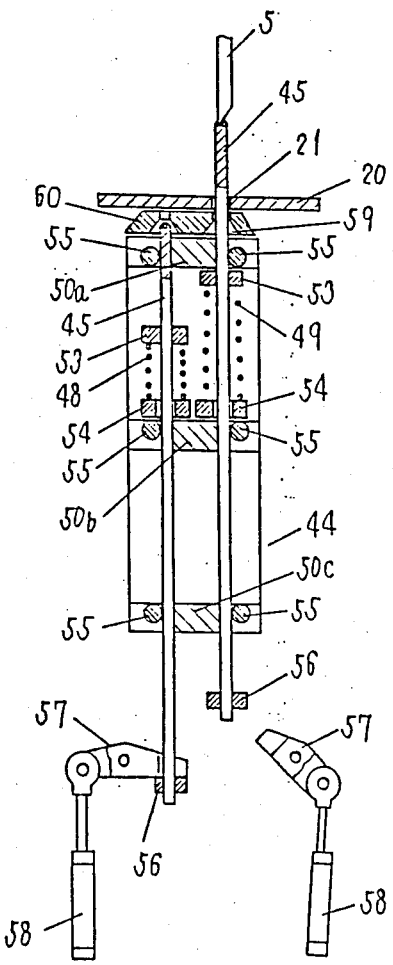

AUTOMATIC INSERTING APPARATUS FOR ELECTRONIC PARTS

FIELD OF TECHNOLOGY

The present invention relates to an automatic inserting apparatus for electronic parts for automatically inserting lead wires of the electronic parts, successively supplied, into inserting holes in a printed circuit board.

BACKGROUND TECHNOLOGY

Hitherto, in an automatic inserting apparatus of this type, in order to improve the production of printed circuit boards with electronic parts actually mounted thereon, it is necessary to quickly insert lead wires of the electronic parts into inserting holes in the printed circuit board without error.

In the conventional apparatus, a guide mechanism for guiding the lead wires of the electronic parts towards the inserting holes in the printed circuit board is so arranged as to contact the printed circuit board directly to enable the insertion of the electronic parts retained by a retaining mechanism. While the lead wires of the electronic parts can be assuredly inserted into the inserting holes in the printed circuit board by the above described guide mechanism, the guide mechanism has to contact the printed circuit board directly, and there is a problem in that the interval between the electronic parts to be inserted must be rendered great, making it difficult to achieve a high density actual mounting of the electronic parts on the printed circuit board.

In view of the above, in order to improve the actual mounting density of the electronic parts on the printed circuit board, there has been proposed an apparatus wherein guide pins are provided so as to extend through the inserting holes in the printed circuit board in a direction counter to the direction of insertion of the electronic parts whereby the lead wires of the electronic parts can be guided by the guide pins so as to be introduced into the inserting holes in the printed circuit board. In the apparatus of the above described construction, since a mechanism for introducing the lead wires of the electronic parts into the inserting holes in the printed circuit board does not directly contact the surface of the printed circuit board, the actual mounting density of the electronic parts on the printed circuit board can be improved. Hereinafter, the conventional automatic mounting apparatus for the electronic parts utilizing this mechanism will be described.

As shown in FIG. 1, a taping component 1 of radial type is such that two lead wires 5 of electronic parts 4 which extend in the same direction are retained in equally spaced relationship by a cardboard tape 2 and an adhesive tape 3. It is to be noted that, in the drawings, 6 represents feed holes formed by punching the cardboard tape 2 and the adhesive tape 3, and the taping component 1 can be transported at any time by driving a feed mechanism while projecting parts (not shown) of the feed mechanism of the inserting apparatus are engaged in the feed holes 6. The taping component 1 so fed is such that, as shown in FIG. 2, the lead wires 5 can be cut by a plain cutter 8 adapted to be slid in a direction shown by the arrow A by an external drive such as an air cylinder and having an L-shaped projection 7 at the free end thereof, and a lead cutter 9 arranged so as to extend in a horizontal direction and slidable in a direction shown by B. In addition, by the plain cutter 8 and a tape cutter 10 arranged so as to extend vertically and slidable in a direction shown by C, the cardboard tape 2 and the adhesive tape (not shown) of the taping electronic component 1 is cut. Within the above described plain cutter 8, a cylinder 11, a piston 12, and a spring 13 are incorporated, and when air is supplied from an air inlet 14 in the plain cutter 8, the piston 12 is slid so as to compress the spring 13 and to permit a rod 15, provided integrally with the piston 12, to project outwards from a cutting plane of the plain cutter 8 thereby to retain the cardboard tape 2, but when the air supply is interrupted, the piston 12 is slid in the reverse direction by a compressive force of the spring 13 to retract the rod 15 inwards from the cutting plane of the plain cutter 8. In this construction, the lead wires 5 and both the cardboard tape 2 and the adhesive tape 3 of the taping component 1 which is intermittently fed to this cutting zone are simultaneously cut. FIGS. 3(a) to 3(c) show examples of the electronic parts 4 after cutting.

The electronic parts 4 wherein the lead wires 5 have been cut in a predetermined length are, as shown in FIGS. 4 and 5, retained by an inserting chuck 16 with the tips of the lead wires 5 inserted into guide holes 18 in guide plates 17. The guide plates 17 are of a paired construction and they can be, as shown in FIGS. 5 and 6, united together and separated from each other as the necessity arises. In the condition wherein the guide plates 17 are united together, the guide holes 18, constricted at the center, but enlarged at the opposite ends, can be formed. Since the opposite ends of the guide holes 18 are thus enlarged while the center thereof is constricted, the position of the lead wires 5 can be readily inserted into the guide holes even if displaced to a certain extent. Below the guide plates 17, a printed circuit board 20 supported by a printed circuit board guide 19 is positioned, and inserting holes 21 in the printed circuit board 20 are inserted from below with guide pins 23 provided on a guide block 22. The tips of the guide pins 23 are inserted from below into the guide holes 18 in the guide plates 17 with the lead wires 5 and the guide pins 23 contacting together at the center of the guide holes 18 in the guide plates 17 as shown in FIG. 7. The tips of the guide pins 23 are provided with recesses 24 equal to or greater than the diameter of the lead wires 5, and the tips of the lead wires 5 are inserted in the recesses 24. When the lead wires 5 are inserted in the recesses 24, the guide plates 17 which separate to divide the guide holes 18 as shown in FIG. 6 are released, and the electronic part 4 is pushed downwards by a pusher rod 25 while the inserting chuck 16 separates from the electronic part 4. Because of this, the electronic part 4 is advanced downwards while sandwiched between the guide pins 23 and the pusher rod 25, with the lead wires 5 consequently inserted into the inserting holes 21 in the printed circuit board 20, thereby completing the inserting operation.

However, where such a method for inserting the taping component is adopted, since the tips of the guide pins 23 must necessarily be provided with the recesses 24 for receiving the tips of the lead wires 5 for avoiding the separation of the lead wires 5 from the guide pins 23, and accordingly, since the outer diameter of the guide pins 23 must necessarily be greater than the outer diameter or the lead wires 5, the inserting holes 21 in the printed circuit board 20 through which the guide pins 23 are to be inserted will be of a greater size than the outer diameter of the lead wire 5 and, when the lead wires 5 are inserted into the inserting holes 21, there is a problem in that a great gap is created and a soldering defect tends to occur. In addition, since the inserting holes 21 are of increased size, it is necessary to enlarge an electroconductive pattern therearound and, as a result thereof, there is a problem in that the actual mounting density of the printed circuit board 20 is reduced.

Moreover, while it is a recent trend to automatically insert the electronic part 4 having three lead wires 5 such as a transistor shown in FIGS. 8 and 9, the automatic insertion of such an electronic part 4 is so structured as to receive only the opposite two lead wires 5 by means of the guide pins 23 and to insert the intermediate lead wire 5 without any guide and, in this case, even if the intermediate lead wire 5 is positioned by the guide plates 17, it often happens that this intermediate lead wire does not completely align with the inserting hole 21 in the printed circuit board 20 and cannot be inserted because of its abutment against the upper surface of the printed circuit board 20, and because of this, the diameter of the inserting holes 21 in the printed circuit board 20 cannot be reduced.

Furthermore, a mechanism for moving the guide pins 23 up and down in the conventional automatic inserting apparatus for the electronic parts is of a construction as shown in FIG. 10, wherein the guide pins 23 are fixed on the tip of the guide block 22 and a lever stopper 26 is fixed to the guide block 22. The guide block 22 is normally upwardly biased through an elevating rod 29 by means of a spring 27 and a spring seat 28. Therefore, it is so constructed that, when a lever 30 is elevated, the elevating rod 29 lifts the guide block 22 with the guide pins 23 inserted through the inserting holes 21 in the printed circuit board 20.

However, when the guide pins 23 extend through the inserting holes 21 in the printed circuit board 20, the guide pins 23 often contact the inner faces of the inserting holes 21 and, in the event of the failure to extend through the inserting holes 21 as shown in FIG. 11, powdery scraps formed by grinding the printed circuit board 20 and scraps of the lead wire 5 will enter the recesses 24 at the tips of the guide pins 23. Because of this, the recesses 24 are often filled up and the percentage of insertion failure is increased.

DISCLOSURE OF THE INVENTION

Accordingly, the present invention has for its object to provide an automatic inserting apparatus for automatically inserting lead wires of the continuously supplied electronic parts, with a supply mechanism for supplying electronic parts, which have lead wires having sharpened tips, towards a predetermined position with the sharpened tips of the electronic parts oriented downwards, and a guide mechanism equipped with a plurality of guide pins arranged below the printed circuit board for movement up and down and adapted to retain the tips of the lead wires of the electronic parts which have been inserted through the inserting holes in the printed circuit board, wherefore the electronic parts can be assuredly inserted in the printed circuit board having small inserting holes.

BEST MODE FOR CARRYING OUT THE INVENTION

Figure 1:
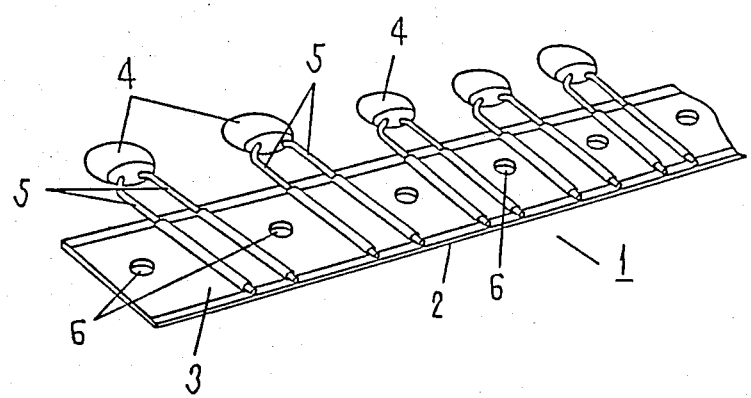
FIG. 1 is a perspective view of a radial taping component.
Figure 2:
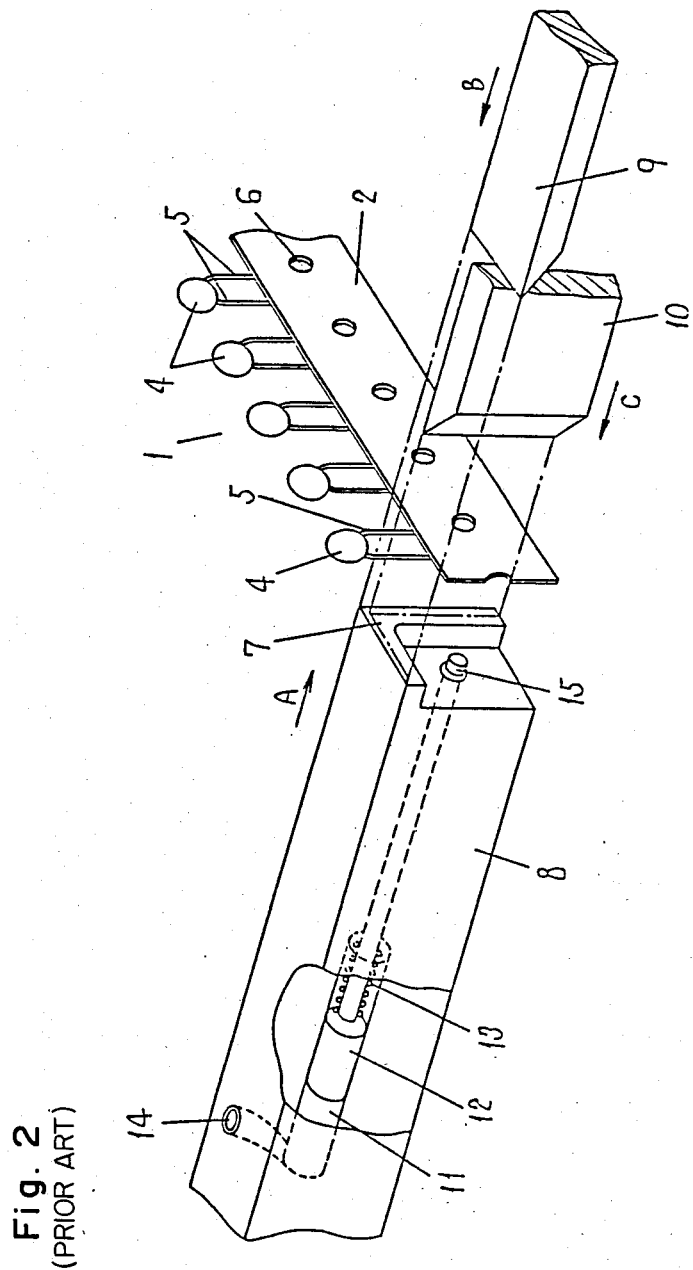
FIG. 2 is a perspective view, with a portion cut away, of the conventionally utilized lead wire cutting device.
Figure 3A:
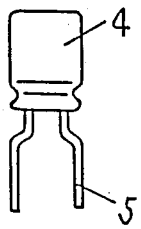
FIGS. 3(a) to (c) are front elevational views of the electronic parts cut by said device.
Figure 3B:
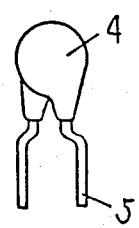
Figure 3C:
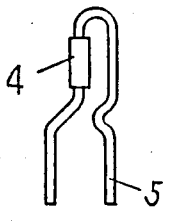
Figure 4:
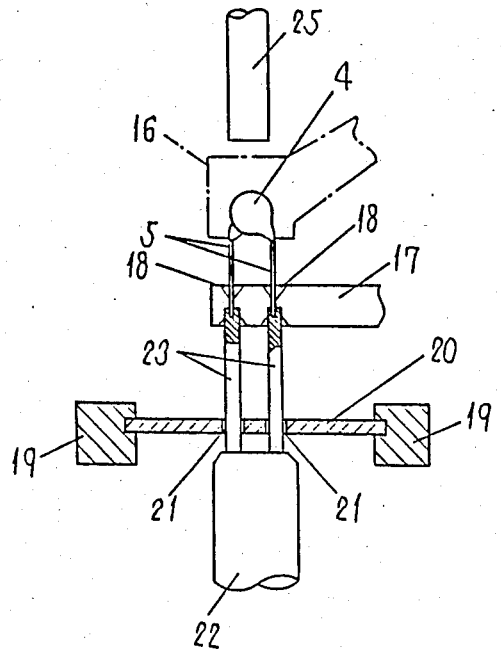
FIG. 4 is a fragmentary sectional view of the conventionally utilized automatic inserting apparatus for the electronic parts.
Figure 5:
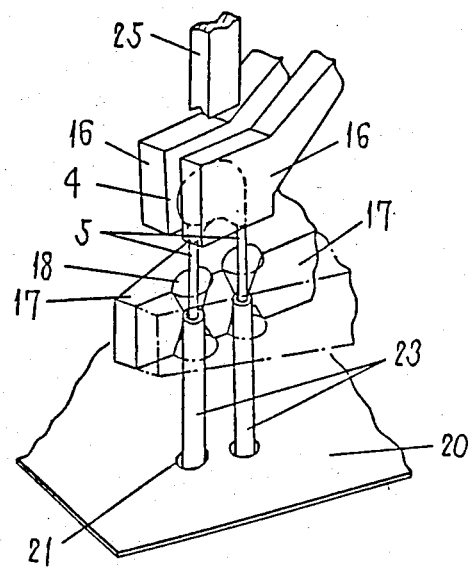
FIGS. 5 and 6 are perspective views showing the sequence of operation of the conventionally utilized automatic inserting apparatus.
Figure 6:
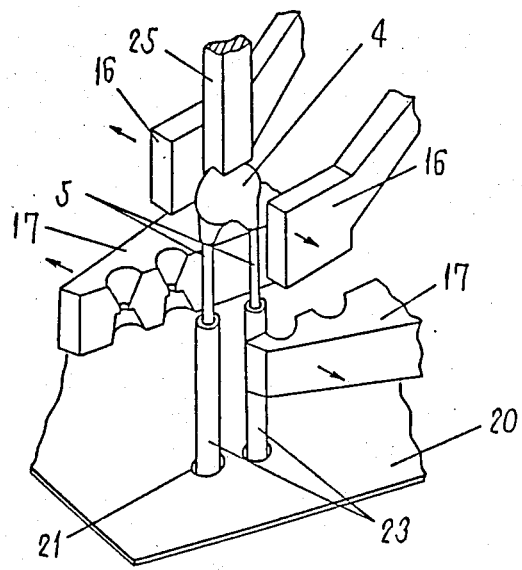
Figure 7:
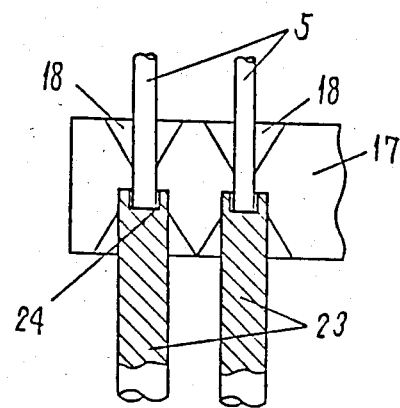
FIG. 7 is a front elevational view, with a portion broken away, showing the condition in which the guide pins and the lead wires are engaged with each other by a guide plate of the automatic inserting apparatus shown in FIG. 5.
Figure 8:
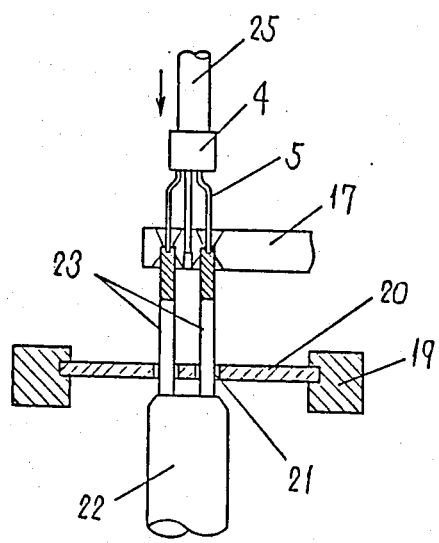
FIG. 8 is a front elevational view, with a portion broken away, showing the condition in which the electronic part having three lead wires is inserted, by the inserting apparatus shown in FIG. 5.
Figure 9:
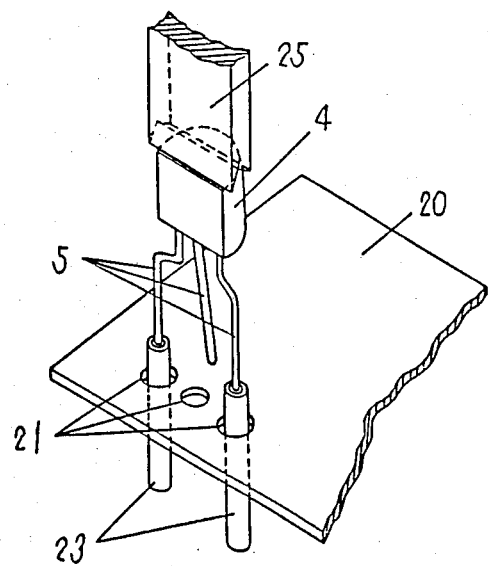
FIG. 9 is a perspective view showing the condition which the operation of the inserting apparatus shown in FIG. 4 is defective.
Figure 10:
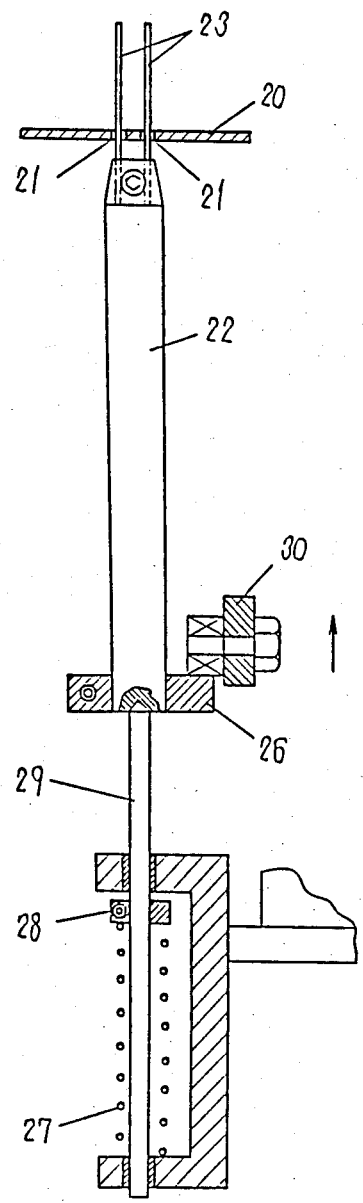
FIGS. 10 and 11 are front elevational views, with a portion broken away, showing the vicinity of a guide block in the inserting apparatus shown in FIG. 4.
Figure 11:
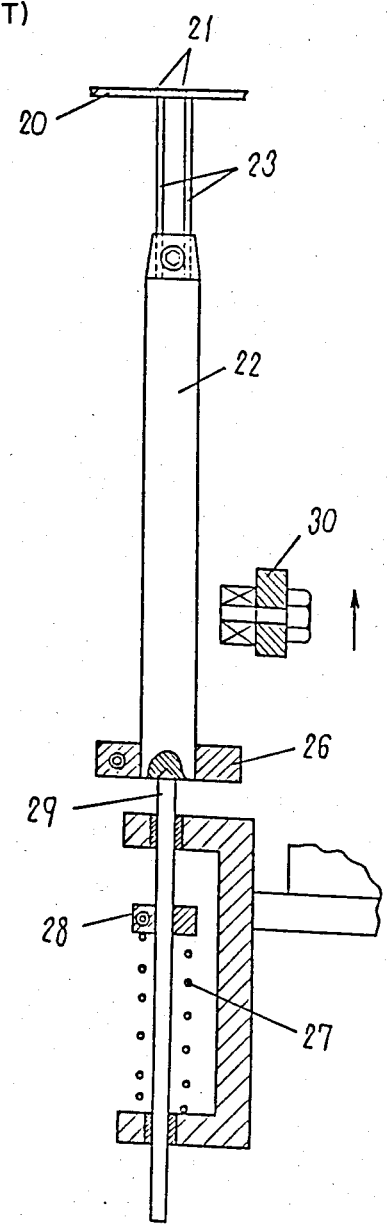
Figure 12:
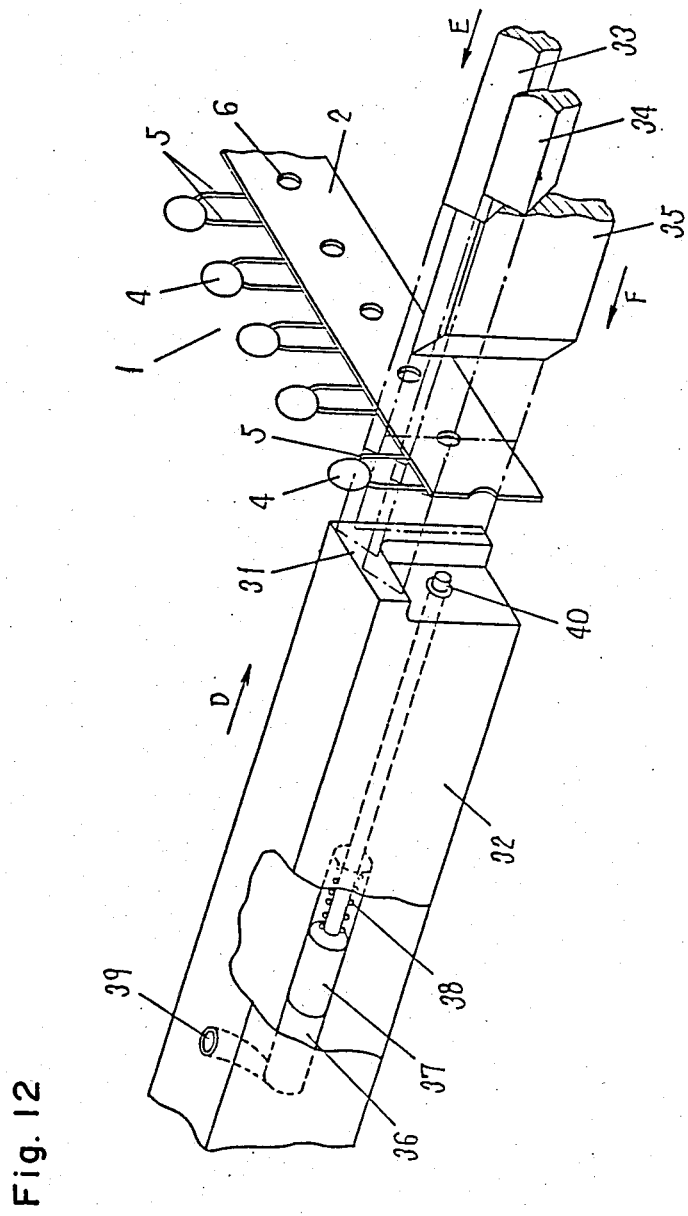
FIG. 12 is a perspective view showing an example of device for cutting the lead wires of the electronic parts in an inserting apparatus according to an embodiment of the present invention.

In FIG. 12, there is shown one example of a device for cutting lead wires of electronic parts in an automatic inserting apparatus for the electronic parts according to the present invention.

Figure 13:
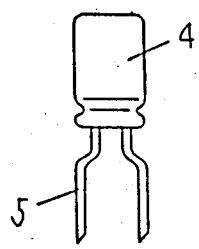
FIG. 13 is a front elevational view of the electronic part having the lead wires cut by the cutting device shown in FIG. 12.
Figure 14:
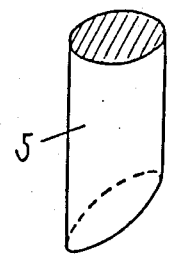
FIG. 14 is a perspective view on an enlarged scale, with a portion removed, showing the tip of the lead wire of the electronic part shown in FIG. 13.

As shown in FIG. 12, the taping component 1 retaining the lead wires 5 of electronic parts 4 by means of the cardboard tape 2, provided with the feed holes 6, and the adhesive tape (not shown) is supplied at any time when projections (not shown) of a feed mechanism of the inserting apparatus are engaged in the feed holes 6 and the feed mechanism is subsequently driven. The taping component 1 so supplied is such that the lead wires 5 can be slantwise cut by a plain cutter 32, adapted to be slid in a direction of the arrow D by an external power such as an air cylinder and having an L-shaped projection 31 at the tip thereof, and two lead cutters 33 and 34 arranged slantwise and adapted to be slid in a direction of the arrow E. Also, by the plain cutter 32 and a tape cutter 35 arranged vertically and slidable in a direction of the arrow F, the cardboard tape 2 and the adhesive tape of the taping component 1 are cut. Within said plain cutter 32, a cylinder 36, a piston 37 and a spring 38 are incorporated, and it is so constructed that, when air is supplied through an air inlet, the piston 37 is slidingly moved to compress the spring 38 to cause a rod 40 provided integrally with the piston 37 to project from a cutting plane of the plain cutter 32 thereby to retain the cardboard tape 2, but when the supply of the air is interrupted, the piston 37 is slidingly moved in the reverse direction by a compressive force of the spring 38 to retract the rod 40 from the cutting plane of the plain cutter 32, wherefore the lead wires 5 and both of the cardboard tape 2 and the adhesive tape, the taping component 1 intermittently supplied to a cutting zone, are simultaneously cut. As a result thereof, the lead wires 5 of the electronic parts have their tips sharpened as shown in FIGS. 13 and 14.

Figure 15:
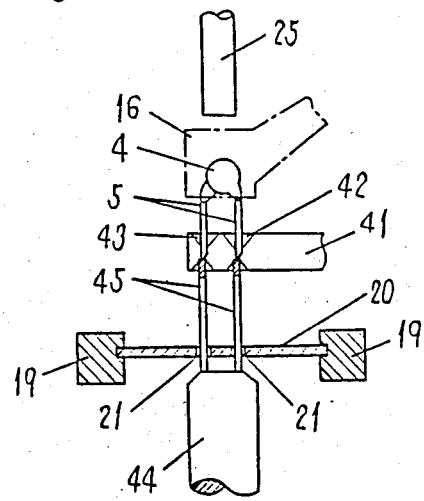
FIG. 15 is a front elevational view, with a portion broken away, of the automatic inserting apparatus according to the embodiment of the present invention.
Figure 16:
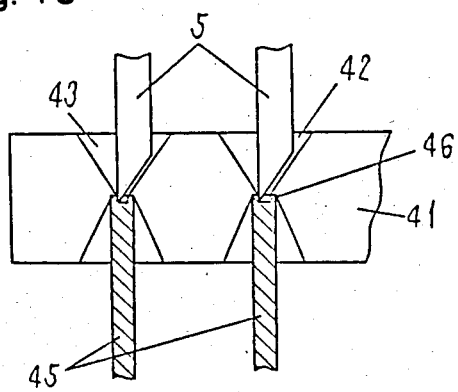
FIG. 16 is a front elevational view, with a portion broken away, showing the condition in which the lead wires and guide pins are engaged with each other by the guide plates of the automatic inserting apparatus shown in FIG. 15.
Figure 17:
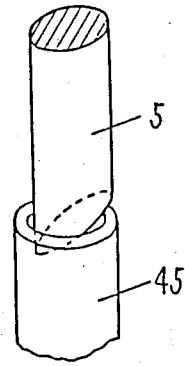
FIG. 17 is a perspective view, on an enlarged scale, showing the condition in which the tips of the lead wires of the electronic part shown in FIG. 13 are engaged with the guide pins of the automatic inserting apparatus shown in FIG. 15, FIGS. 18 and 19 are, respectively, a front elevational view, with a portion broken away, and a perspective view, showing the condition in which the joints between the guide pins and the lead wires shown in FIG. 17 are passed through the inserting holes in the printed circuit board.

The electronic part 4 having the lead wires 5 so cut is retained by the inserting chuck 16 with the tips of the lead wires 5 inserted into guide holes 42 and 43 in a paired guide plate 41 as shown in FIG. 15. Since the guide holes 42 and 43 in the guide plate 41 are constricted at their intermediate portions but enlarged at their opposite ends, the lead wires 5 even though displaced a certain extent in position can readily be inserted into the guide holes 42 and 43. The printed circuit board 20 having its opposite ends supported by the printed circuit board guide 19 is positioned below the guide plate 41, and through the inserting holes 21 in the printed circuit board 20 guide pins 45 provided in a guide block 44 are passed from below. Then, the tips of the guide pins 45 are inserted from below into the guide holes 42 and 43 in the guide plate 41, and the lead wires 5 and the guide pins 45 are axially aligned with each other at the intermediate portions of the guide holes 42 and 43 in the guide plate 41 and abut with each other in a manner as shown in FIG. 17. The tips of the guide pins 45 are provided with recesses 46 into which the tips of the lead wire 5 are engaged. In view of the fact that the lead wires 5 are sharpened, the recesses 46 may be smaller than the outer diameter of the lead wires 5. Therefore, it is possible to make the outer diameter of the guide pins 45 smaller than the outer diameter of the lead wires 5.

Figure 18:
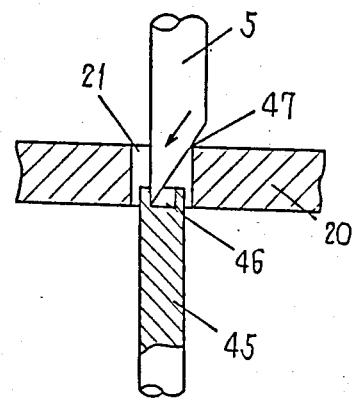
Figure 19:
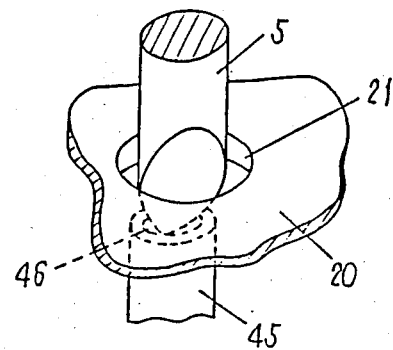
Figure 20:
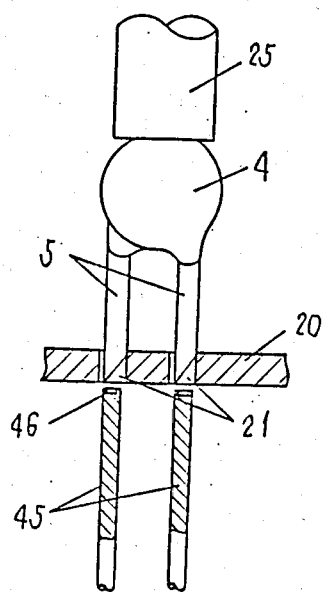
FIGS. 20 and 21 are front elevational views, with a portion broken away, showing the condition in which the lead wires of the electronic part are inserted through the inserting holes in the printed circuit board by the automatic inserting apparatus shown in FIG. 15.
Figure 21:
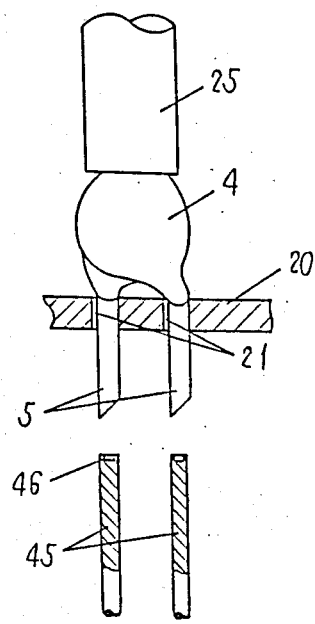

When the lead wires 5 are engaged in the recesses 46 of the guide pins 45, the paired guide plate 41 is released, and the pusher rod 25 positioned above the electronic part 4 pushes the electronic part 4 downwards. When the electronic part 4 is moved downwards while sandwiched between the pusher rod 25 and the guide pins 45 and the tips of the lead wires 5 then arrive at the inserting holes 21 in the printed circuit board 20 as shown in FIGS. 18 and 19, the lead wires 5 because the tips thereof are sharpened are inserted with cutting plane 47 sliding in contact with ends of the inserting holes 21 and are then passed through the inserting holes 21 only by the pressure of the pusher rod 25 whereby the electronic part 4 is assuredly actually mounted on the printed circuit board 20 as shown in FIGS. 20 and 21.

By sharpening the tips, the outer diameter of the guide pins 45 can be reduced to a value smaller than those in the prior art and, hence, the lead inserting holes 21 in the printed circuit board 20 can also be reduced to a value smaller than those in the prior art. Accordingly, even at the time the lead wires 5 of the electronic parts 4 are inserted into the inserting holes 21, the clearance between the lead wires 5 and the inserting holes 21 can be minimized. Therefore, soldering between the electroconductive pattern (not shown) in the printed circuit board 20 and the lead wires 5 can be assuredly carried out.

It is to be noted that although the guide pins 45 can be made smaller than the outer diameter of the lead wires 5, it is preferable that they not be made smaller than the lead wires 5, since the guide pins 45 are preferred to have the same outer diameter as that of the lead wires 5 in terms of the strength.

In addition, the guide pins 45 of small outer diameter if fixed to the guide block 44 as is the case with the prior art tend to be buckled by obstructions such as the printed circuit board 20 having a defect such as incomplete perforating of the inserting holes 21.

Figure 22:
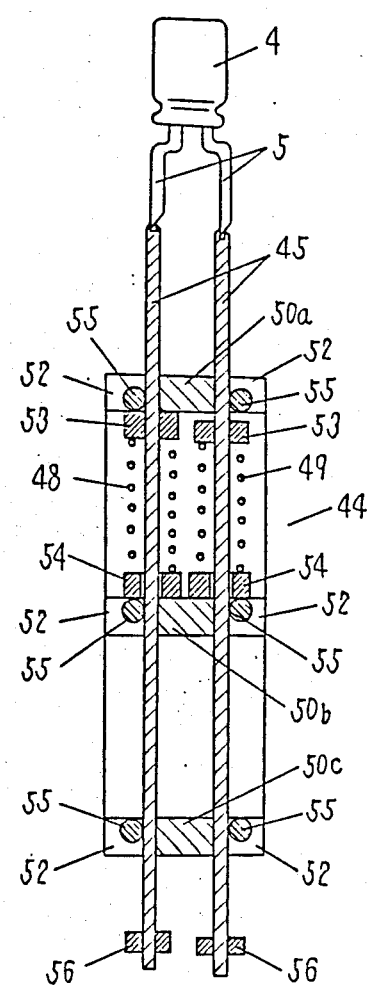
FIG. 22 is a front elevational view, with a portion broken away, showing the condition in which the guide pins, retained by a guide block, and the lead wires of the electronic part are engaged with each other.
Figure 23:
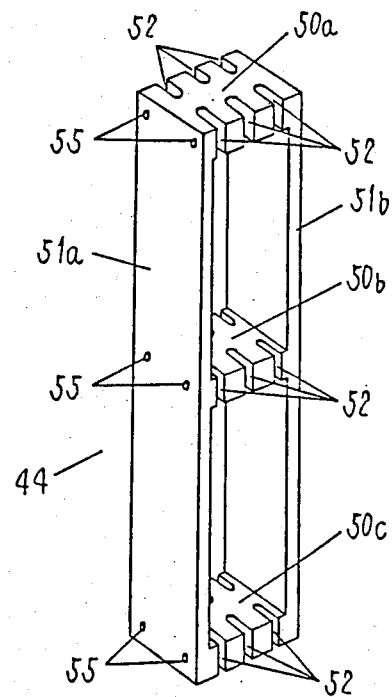
FIGS. 23 and 24 are perspective and top plan views of the guide block shown in FIG. 22, FIGS. 25 and 26 are front elevational views, with a portion broken away, showing the steps in which the guide pins retained by the guide block shown in FIG. 22 are selected and inserted into the inserting holes in the printed circuit board.
Figure 24:
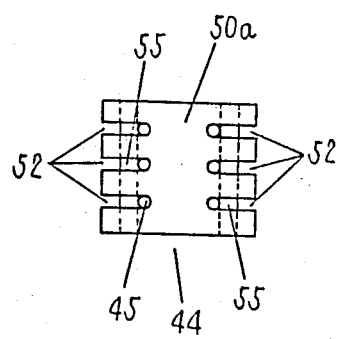

Therefore, the guide pins 45 are supported for movement up and down relative to the guide block 44 by means of springs 48 and 49 as shown in FIG. 22. As shown in FIG. 23, the guide block 44 is constituted by three frames 50a to 50c and two side walls 51a and 51b, each of said frames 50a to 50c having grooves 52 formed therein. The guide pins 45 are inserted through the grooves 52 so that stoppers 53, fixed on upper intermediate portions of the guide pins 45, and both of the springs 48 ano 49 and spring seats 54 positioned below the stoppers 53 and mounted around the guide pins 45 can be positioned between the frames 50a and 50b of the guide block 44. The guide pins 45 will not separate from the grooves 52 because of the provision of shafts 55 in the guide block 44 as shown in FIGS. 22 and 24. The lower ends of the guide pins 45 which project outwards from the guide block 44 each have a guide pin holder 56 fixed thereto.

Because of the above described construction, when the guide block 44 moves up and down, the springs 48 and 49 on the spring seats 54 mounted on the frame 50b push the stopper 53 and, accordingly, the guide pins 45 move up and down.

In the case where the lead wires 5 of the electronic parts 4 have deviations, the springs 49 are compressed according to the deviations of the lead wires 5 and, therefore, the respective guide pins 45 can assuredly contact the lead wires 5 so that the lead wires 5 can be assuredly introduced into the inserting holes 21 in the printed circuit board 20.

Hereinafter, the case wherein the radial electronic part 4 having three or more lead wires 5 is highly reliably inserted in the inserting holes 21 will be illustrated. In this case, the guide pins 45 corresponding to the lead wires 5 must be independently moved above the printed circuit board 20 so that the guide pins 45 can receive all of the lead wires 5. This structure is shown in FIG. 25. Levers 57 for depressing the guide pin holder 56 are arranged below the guide block 44, and cylinders 58 for moving the levers 57 up and down are provided. In FIG. 25, the left-hand lever 57 is shown as depressing the guide pin holder 56. The condition in which the guide block 44 is elevated is shown in FIG. 26. The right-hand guide pin 45 extends upwardly through the inserting hole 21 in the printed circuit board 20 with its tip receiving the lead wire 5 for the introduction into the inserting hole 21. The left-hand guide pin 45 will, because the guide pin holder 56 is depressed by the lever 57, not move upwards together with the guide block 44 even if the guide block 44 is elevated.

As in the case with this structure, by the employment of the structure wherein the plurality of the guide pins 45 are provided beneath the printed circuit board 20, so that the guide pins 45 corresponding to all of the lead wires 5 can be selectively and independently inserted through the inserting holes 21 in the printed circuit board 20 one at a time to permit all of the lead wires 5 to be eventually received by the guide pins 45, the radial electronic parts 4 having three or more lead wires 5 can be highly reliably inserted into the inserting holes 21.

It is also possible to assuredly insert the guide pins 45 through the inserting holes 21 of small diameter if, as shown in FIGS. 25 and 26, a guide pin guide 60 having through-holes 59 of reversed funnel shape is arranged below the printed circuit board 20 for the guidance of the guide pins 45.

Figure 27:
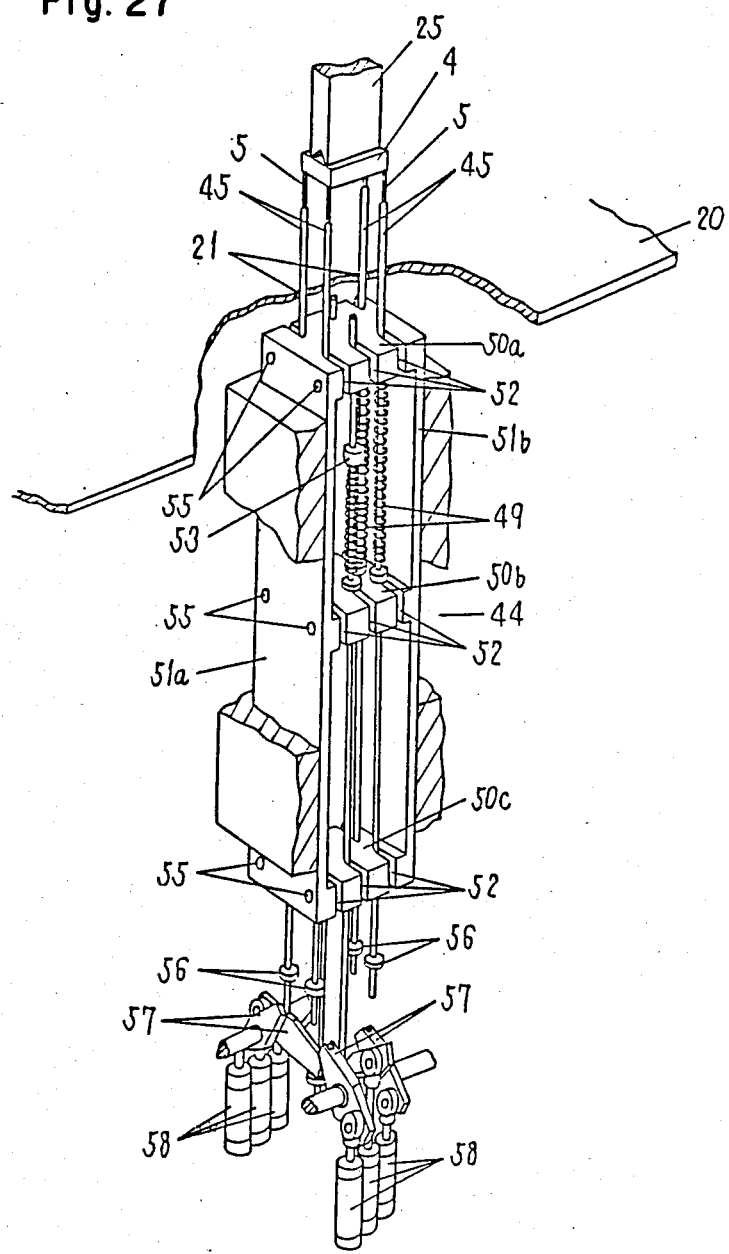
FIG. 27 is a perspective view, with a portion broken away, showing the condition in which the guide pins, retained by the guide pins shown in FIG. 22 and then selected, and the tips of the lead wires of the electronic part are engaged with each other.

Another embodiment of the present invention is shown in FIG. 27.

In this embodiment, the guide pins 45 are arranged below the printed circuit board, and a unit of the guide block 44 is arranged for movement up and down, there being provided a mechanism for depressing the guide pin holder 56 secured to the lower ends of the guide pins 45. In FIG. 27, the case wherein the electronic parts 4 having four parallel lead wires 5 are inserted is shown, and since the intermediate guide pin holders 56 are depressed by the intermediate levers 57, the two intermediate guide pins 45 will not elevate. The other four guide pins 45 can extend through the inserting holes 21 in the printed circuit board 20 with the four lead wires 5 engaged in the recesses 46 at the tips of the guide pins 45, and the guide pins 45 while holding the electronic part 4 in cooperation with the pusher rod 25 insert the electronic part 4 in the printed circuit board 20.

Figure 28:
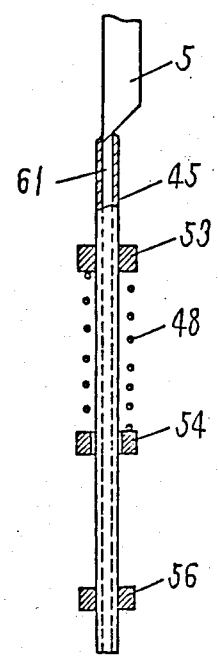
FIG. 28 is a front elevational view, with a portion broken away, showing the guide pins used in the automatic inserting apparatus according to another embodiment of the present invention.

In addition, it may happen that, because of clogging of the recesses 46 at the tips of the guide pins 45, the percentage of occurrence of the insertion failure will become high, and it is recommended to employ hollow pipes or tubes for the guide pins 45 as shown in FIG. 28. Powder of the printed circuit board 20 ground by these guide pins 45 and scraps of the lead wires 5 can escape from the lower ends of the guide pins 45 even if entering holes 61 in the guide pins 45 and, therefore, the insertion of the lead wires 5 can be achieved with high reliability without any clogging.

Figure 29:
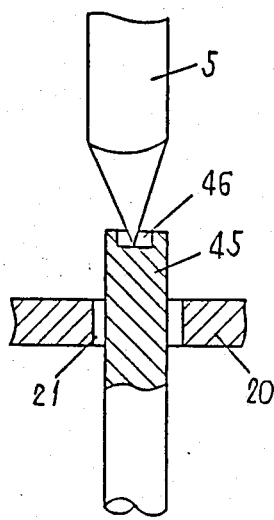
FIGS. 29 and 30 are front elevational views, with a portion broken away, showing the condition in which the tips of the lead wires of the electronic part to be inserted into the inserting holes in the printed circuit board by the inserting apparatus shown in FIG. 15, and the guide pins abutting against the lead wires thereof are engaged with each other.
Figure 30:
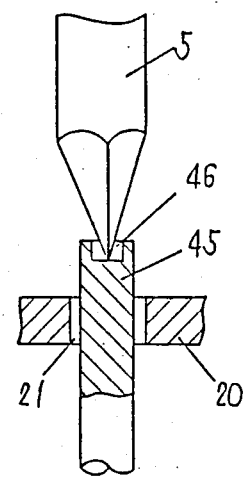

In the foregoing embodiment, the lead wires 5 have been cut slantwise by the lead cutter 33, but the tips of the lead wires 5 may be cut to a conical shape or a pyramid shape as shown in FIGS. 29 and 30 with the substantial centers of the tips of the lead wires 5 pointed. In particular, because the tips of the lead wires 5 are positioned centrally of the lead wires 5, they can readily enter the recesses 46 of the guide pins 45 and hence the inserting work can be stabilized.

Figure 31:
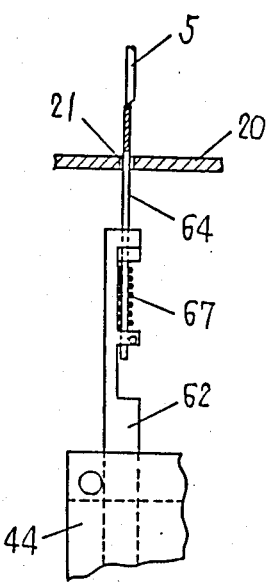
FIG. 31 is a front elevational view, with a portion broken away, showing the condition wherein the guide pins forming the automatic inserting apparatus according to a further embodiment of the present invention are fitted to a rod.
Figure 32:
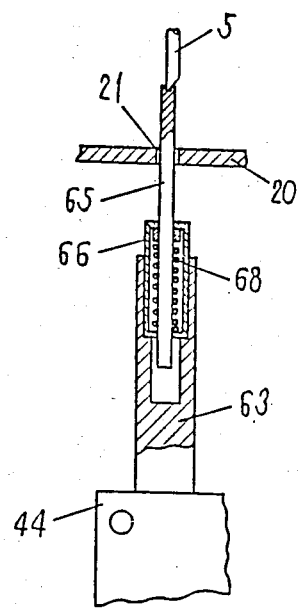
FIG. 32 is a front elevational view, with a portion broken away, showing the condition wherein the guide pins forming the automatic inserting apparatus according to the further embodiment of the present invention are fitted to the rod in the form as incorporated in a holder.

As further embodiments, examples wherein instead of the guide pins 45 shown in FIG. 22, rods 62 or rods 63 are employed with guide pins 64 mounted on the rods 62 or with guide pins 65 incorporated in holders 66 are shown in FIGS. 31 and 32. In this construction, by press-fitting holders 66 into the rods 63, the interchange of the guide pins 64 and 65 can be facilitated.

Also, the springs 48 and 49 provided on the guide pins 45 as shown in FIG. 23 are required to be adequately strong springs since they require a force necessary to accommodate the deviations of the lead wires 5 and to move the guide pins 45 in correspondence with the guide block 44 to insert them through the inserting holes 21 of small diameter in the printed circuit board 20. However, in the embodiments of FIGS. 31 and 32, since the force necessary to insert rhe guide pins 64 and 65 through the inserting holes 21 in the printed circuit board 20 can be obtained from springs (not shown) provided on the rods 62 and 63, weak springs 67 and 68 for accommodating the deviations of the lead wires 5 can be employed for the guide pins 64 and 65. Springs 67 and 68 can cope with even slight deviations of the lead wires 5 wherefore not only can the stability of the insertion of the lead wires 5 be increased, but also the force acting on the guide pins 64 and 65 can be reduced and, therefore, the life of the guide pins 64 and 65 can be increased.

INDUSTRIAL APPLICABILITY

As hereinbefore described, according to the automatic inserting apparatus for the electronic parts embodying the present invention, since the outer diameter of the guide pins is reduced to a small value by the provision of the supply mechanism for supplying electronic parts, which have lead wires having sharpened tips, towards a predetermined position with the sharpened tips of the electronic parts oriented downwards and a guide mechanism equipped with a plurality of guide pins arranged below the printed circuit board for movement up and down and adapted to retain the tips of the lead wires of the electronic parts which have been inserted through the inserting holes in the printed circuit board, not only can the lead wires be inserted in the inserting holes of small diameter in the printed circuit board, but also the land diameter of the printed circuit board can be reduced, and the printed circuit board can be reduced in size, thereby contributing to the high density of the printed circuit board.

Moreover, since the guide pins receive all of the lead wires while the guide pins have been elevated above the printed circuit board successively, the radial electronic parts having the three or more lead wires can be inserted in the small inserting holes with high reliability.

We claim:

1. An automatic inserting apparatus for automatically inserting lead wires of electronic parts, which are successively supplied, into inserting holes in a printed circuit board, which apparatus comprises:
   a cutting mechanism for sharpening respective tips of lead wires of electronic parts by cutting respective tips of the lead wires of each electronic part;
   a supply mechanism for successively supplying the electronic parts, having the sharpened lead wires, to a predetermined position with the sharpened lead wires oriented downwards towards a circuit board; and
   a lead wire guide mechanism including a plurality of elongated lead wire guide pins and means disposed beneath the printed circuit board for moving said guide pins towards and away from the circuit board said guide pins having recesses at ends thereof facing the circuit board and said guide pins having diameters equal to or less than the diameters of the lead wires inserted in the circuit board, said guide pins when moved upwards penetrating through respective inserting holes in the circuit board to receive only the sharpened tips of the respective lead wires.

2. An automatic inserting apparatus for electronic parts as claimed in claim 1, wherein means is provided to selectively engage individual guide pins whereby said means for moving said guide pins is operable to move only individual guide pins which correspond to a pattern of three or more lead wires of an electronic part to be inserted into the circuit board.

3. An automatic inserting apparatus for electronic parts as claimed in claim 1, wherein a guide pin holder is disposed on each of said guide pins and said guide mechanism for said plurality of guide pins includes a guide block for moving and guiding said guide pins, spring means for urging said guide block towards the circuit board and levers selectively engageable with respective guide pin holders for preventing respective guide pins from moving towards the circuit board.

4. An automatic inserting apparatus for electronic parts as claimed in claim 1, wherein means is provided to prevent individual guide pins from moving towards the circuit board.

5. An automatic inserting apparatus for electronic parts as claimed in claim 1, wherein said guide pins comprise hollow pipes.

6. An automatic inserting apparatus for automatically inserting lead wires of electronic parts, which are successively supplied, into inserting holes in a printed circuit board, which apparatus comprises:
   a cutting mechanism for sharpening respective tips of lead wires of electronic parts by cutting respective tips of the lead wires of each electronic part;
   a supply mechanism for successively supplying the electronic parts, having the sharpened lead wires, to a predetermined position with the sharpened lead wires oriented downwards towards a circuit board;
   a lead wire guide mechanism including a plurality of elongated lead wire guide pins and means disposed beneath the printed circuit board for moving said guide pins towards and away from the circuit board, said guide pins having recesses at ends thereof facing the circuit board and said guide pins having diameters equal to or less than the diameters of the lead wires inserted in the circuit board, said guide pins when moved upwards penetrating through respective inserting holes in the circuit board to receive only the sharpened tips of the respective lead wires; and
   a guide plate disposed above the circuit board for aligning the lead wires with the respective guide pins.

7. An automatic inserting apparatus for electronic parts as claimed in claim 6, wherein means is provided to selectively engage individual guide pins whereby said means for moving said guide pins is operable to move only individual guide pins which correspond to a pattern of three or more lead wires of an electronic part to be inserted into the circuit board.

8. An automatic inserting apparatus for electronic parts as claimed in claim 6, wherein a guide pin holder is disposed on each of said guide pins and said guide mechanism for said plurality of guide pins includes a guide block for moving and guiding said guide pins, spring means for urging said guide block towards the circuit board and levers selectively engageable with respective guide pin holders for preventing respective guide pins from moving towards the circuit board.

9. An automatic inserting apparatus for electronic parts as claimed in claim 6, wherein means is provided to prevent individual guide pins from moving towards the circuit board.

10. An automatic inserting apparatus for electronic parts as claimed in claim 6, wherein said guide pins comprise hollow pipes.

11. An automatic inserting apparatus for automatically inserting lead wires of electronic parts, which are successively supplied, into inserting holes in a printed circuit board, which apparatus comprises:
   a cutting mechanism for forming tapered points on inserting ends of lead wires of electronic parts by cutting respective tips of the lead wires of each electronic part;
   a supply mechanism for successively supplying the electronic parts, having the tapered lead wires, to a predetermined position with the lead wires oriented downwards towards a circuit board; and
   a lead wire guide mechanism including a plurality of elongated lead wire guide pins and means disposed beneath the printed circuit board for moving said guide pins towards and away from the circuit board, said guide pins having diameters equal to or less than diameters of the lead wires inserted in the circuit board, said guide pins each having a hollow pipe shape and when moved upwards penetrating through respective inserting holes in the circuit board to receive only the tapered points of the respective lead wires.

12. An automatic inserting apparatus for electronic parts as claimed in claim 11, wherein means is provided to selectively engage individual guide pins whereby said means for moving said guide pins is operable to move only individual guide pins which correspond to a pattern of three or more lead wires of an electronic part to be inserted into the circuit board.

13. An automatic inserting apparatus for electronic parts as claimed in claim 11, wherein a guide pin holder is disposed on each of said guide pins and said guide mechanism includes a guide block for moving and guiding said guide pins, spring means for urging said guide block towards the circuit board and levers selectively engageable with respective guide pin holders for preventing respective guide pins from moving towards the circuit board.

14. An automatic inserting apparatus for electronic parts as claimed in claim 11, wherein means is provided to prevent individual guide pins from moving towards the circuit board.

* * * * *